United States Patent
Inoue et al.

(10) Patent No.: US 6,566,691 B1
(45) Date of Patent: May 20, 2003

(54) SEMICONDUCTOR DEVICE WITH TRENCH GATE HAVING STRUCTURE TO PROMOTE CONDUCTIVITY MODULATION

(75) Inventors: Tomoki Inoue, Tokyo (JP); Koichi Sugiyama, Omiya (JP); Hideaki Ninomiya, Yokohama (JP); Tsuneo Ogura, Kamakura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/672,963

(22) Filed: Sep. 29, 2000

(30) Foreign Application Priority Data

Sep. 30, 1999 (JP) ............................................. 11-278254
Sep. 30, 1999 (JP) ............................................. 11-280046

(51) Int. Cl.⁷ ............................................. H01L 29/78
(52) U.S. Cl. ...................... 257/139; 257/330; 257/133
(58) Field of Search ................................ 257/124, 133, 257/137–139, 141, 401, 330–331

(56) References Cited

U.S. PATENT DOCUMENTS

| 5,448,083 A | 9/1995 | Kitagawa et al. ............ 257/139 |
| 5,585,651 A | 12/1996 | Kitagawa et al. ............ 257/139 |
| 5,689,121 A | 11/1997 | Kitagawa et al. ............ 257/139 |
| 5,838,026 A | 11/1998 | Kitagawa et al. ............ 257/139 |
| 5,894,149 A * | 4/1999 | Uenishi et al. .............. 257/331 |
| 5,895,951 A * | 4/1999 | So et al. ...................... 257/330 |
| 6,184,555 B1 * | 2/2001 | Tihanyi et al. ............... 257/342 |
| 6,238,981 B1 * | 5/2001 | Grebs .......................... 438/272 |

FOREIGN PATENT DOCUMENTS

| JP | 07050405 | * 2/1995 |
| JP | 10-256550 | 9/1998 |

OTHER PUBLICATIONS

Tsutomu Sato, et al., "A New Substrate Engineering for the Formation of Empty Space in Silicon (ESS) Induced by Silicon Surface Migration," IEEE, IEDM 99, 1999, pp. 517–520.

* cited by examiner

*Primary Examiner*—Minh Loan Tran
*Assistant Examiner*—Thomas L Dickey
(74) *Attorney, Agent, or Firm*—Oblon, Spivak, McClelland, Maier & Neustadt, P.C.

(57) ABSTRACT

An IGBT has a p-emitter layer and p-base layer, which are arranged on both sides of an n-base layer. A pair of main trenches are formed to extend through the p-base layer and reach the n-base layer. In a current path region interposed between the main trenches, a pair of n-emitter layers are formed on the surface of the p-base layer. A narrowing trench is formed to extend through the p-base layer and reach the n-base layer. The narrowing trench narrows a hole flow path formed from the n-base layer to the emitter electrode through the p-base layer, thereby increasing the hole current resistance.

14 Claims, 14 Drawing Sheets

SEMICONDUCTOR DEVICE WITH TRENCH GATE HAVING STRUCTURE TO PROMOTE CONDUCTIVITY MODULATION

CROSS-REFERENCE TO RELATED APPLICATIONS

This application is based upon and claims the benefit of priority from the prior Japanese Patent Applications No. 11-278254, filed Sep. 30, 1999; and No. 11-280046, filed Sep. 30, 1999, the entire contents of which are incorporated herein by reference.

BACKGROUND OF THE INVENTION

The present invention relates to a semiconductor device with a trench gate, such as an insulated-gate-type transistor (IGBT (Insulated Gate Bipolar Transistor)).

In an insulated-gate-type semiconductor device such as an IGBT, the conduction loss can be reduced by a buried trench gate. This is because forming a fine trench gate increases the channel density, and forming a deep trench gate promotes conductivity modulation.

FIGS. 20A and 20B are sectional and plan views, respectively, showing a conventional IGBT with a trench gate. FIG. 20A shows a section taken along a line XXA—XXA in FIG. 20B.

In this IGBT, a p-base layer 102 is formed on an n-base layer 101. A plurality of trenches 103 having a stripe structure are formed to extend through the p-base layer 102 and reach the n-base layer 101. In each trench 103, a gate electrode 104 is buried via a gate insulating film 111 formed on the sidewall and bottom surface. An n-emitter layer 105 is formed in the p-base layer 102 to come into contact with the trench 103.

An insulating film 108 is selectively formed on the p-base layer 102, n-emitter layers 105, and trenches 103. An emitter electrode 109 is formed on the insulating film 108 and comes into contact with the n-emitter layer 105 and p-base layer 102 through contact holes. A p-emitter layer 107 is formed on the opposite-side surface of the n-base layer 101 via an n-buffer layer 106. A collector electrode 110 is further formed in contact with the p-emitter layer 107.

To operate this IGBT, a positive bias is applied across the collector electrode 110 and emitter electrode 109, and in this state, a positive bias is applied to the gate electrode 104. At this time, an inversion layer is formed in the p-base layer 102 along the surface of the gate insulating film 111, and electrons are injected from the n-emitter layer 105 into the n-base layer 101. On the other hand, holes are injected from the p-emitter layer 107 into the n-base layer 101 in correspondence with the injected electron amount. As the n-base layer 101 is filled with carriers, conductivity modulation occurs. For this reason, the resistance of the n-base layer 101 decreases to turn on the device.

In the IGBT shown in FIGS. 20A and 20B, one factor that determines the conduction loss in the ON state is the resistance of the n-base layer 101 when conductivity modulation has occurred. The resistance of the n-base layer 101 depends on the total amount of carriers that fill this layer. The total amount of carriers is determined by the ratio of an electron current to a hole current, flowing from the n-base layer 101 to the p-base layer 102. As the distance between the trenches 103, which determines the width of a current path region 131 connected to the emitter electrode 109, decreases, the resistance in flow of the holes to the emitter electrode 109 through the p-base layer 102 increases. For this reason, the amount of carriers filling the n-base layer 101 increases, and the conduction loss decreases.

However, when the distance between the trenches 103 decreases, the alignment margin between a trench formation mask and a contact formation mask decreases, and the number of defects increases in the manufacturing process, resulting in low yield. To ensure the minimum necessary mask alignment margin, the distance between the trenches 103 cannot be reduced excessively. That is, since the distance between the trenches 103 cannot be reduced below a given value, the hole flow resistance cannot be increased on the basis only of a decreasing in this distance.

In the IGBT shown in FIGS. 20A and 20B, the other factor that determines the conduction loss in the ON state is the resistance of a channel induced by the gate electrode 104. The channel resistance can be lowered by increasing the area of a region where the channel is induced, i.e., by increasing the density in the channel region. However, when the distance between the trenches 103 is determined, the density of the p-base layer 102 also increases with increasing channel density. That is, the decrease in channel resistance and promotion of conductivity modulation have tradeoff relationships, and therefore, the conduction loss can be decreased only to a limited level.

Devices with a large current capacity are generally used in parallel connection. In the conventional structure, however, since trench gates are formed at a high density, the electrostatic capacitance between a gate electrode and a main electrode (collector electrode or emitter electrode) becomes large. This electrostatic capacitance causes delay or nonuniformity in switching operation or generates parasitic oscillation.

In the IGBT shown in FIGS. 20A and 20B, since the gate-collector capacitance acts as a mirror capacitance in turning off, a period (to be referred to as a mirror period hereinafter) when a predetermined potential difference is held between the gate and the emitter is generated. If the mirror period is long, the energy loss in turning off is large because the energy loss is in proportion to the turn-off time. In addition, during the mirror period, the potential is unstable, and a current readily concentrates in a large-size device or in parallel operation of devices, resulting in lower controllable current of the device.

Hence, the characteristics of the semiconductor device can be improved by shortening the mirror period. However, in the conventional IGBT with a trench gate, a non-current path region 132 which is not connected to the emitter electrode 109 contributes to the gate-collector capacitance. As a consequence, the gate-collector capacitance increases, and the mirror period becomes long.

BRIEF SUMMARY OF THE INVENTION

It is an object of the present invention to provide a semiconductor device with a trench gate, which can increase the hole flow resistance without reducing the distance between trenches and decrease the conduction loss.

It is another object of the present invention to provide a semiconductor device with a trench gate, which can reduce the gate-collector capacitance without increasing the conduction loss.

It is still another object of the present invention to provide a semiconductor device with a trench gate, which can reduce the conduction loss beyond the limit of a prior-art device (increase the channel density and promote conductivity modulation) and also facilitate parallel connection.

According to the first aspect of the present invention, there is provided a semiconductor device with a trench gate, comprising:

a first semiconductor layer of first conductivity type;

a second semiconductor layer of second conductivity type, which is arranged on the first semiconductor layer, to inject carriers of second conductivity type into the first semiconductor layer;

a third semiconductor layer of second conductivity type, which is arranged on the first semiconductor layer, to collect the carriers of second conductivity type in the first semiconductor layer from the first semiconductor layer;

a pair of trench portions extending through the third semiconductor layer and reaching the first semiconductor layer;

a pair of gate electrode portions disposed in the pair of trench portions via gate insulating films, respectively;

a pair of fourth semiconductor layer portions of first conductivity type, which are formed along the pair of trench portions, respectively, in a surface portion of the third semiconductor layer interposed between the pair of trench portions, each of the fourth semiconductor layer portions being arranged to inject carriers of first conductivity type through a channel induced in the third semiconductor layer by the gate electrode portion into the first semiconductor layer and cause conductivity modulation therein;

a first main electrode disposed in contact with the second semiconductor layer;

a second main electrode disposed in contact with the third semiconductor layer and fourth semiconductor layer portions; and a narrowing trench formed between the pair of fourth semiconductor layer portions to extend through the third semiconductor layer and reach the first semiconductor layer, and to narrow a flow path of the carrier of second conductivity type, which is formed from the first semiconductor layer to the second main electrode through the third semiconductor layer.

According to the second aspect of the present invention, there is provided a semiconductor device with a trench gate, comprising:

a first semiconductor layer of first conductivity type;

a second semiconductor layer of second conductivity type, which is arranged on the first semiconductor layer, to inject carriers of second conductivity type into the first semiconductor layer;

a third semiconductor layer of second conductivity type, which is arranged on the first semiconductor layer, to collect the carriers of second conductivity type in the first semiconductor layer from the first semiconductor layer;

a pair of trench portions extending through the third semiconductor layer and reaching the first semiconductor layer;

a pair of gate electrode portions disposed in the pair of trench portions via gate insulating films, respectively;

a pair of fourth semiconductor layer portions of first conductivity type, which are formed along the pair of trench portions, respectively, in a surface portion of the third semiconductor layer which is not interposed between the pair of trench portions, each of the fourth semiconductor layer portions being arranged to inject carriers of first conductivity type through a channel induced in the third semiconductor layer by the gate electrode portion into the first semiconductor layer and cause conductivity modulation therein;

a first main electrode disposed in contact with the second semiconductor layer;

a second main electrode disposed in contact with the third semiconductor layer and fourth semiconductor layer portions; and an isolation insulating layer formed between the pair of trench portions to isolate, from the first semiconductor layer, a semiconductor layer in a non-current path region interposed between the pair of trench portions.

According to the third aspect of the present invention, there is provided a semiconductor device with a trench gate, comprising:

a first semiconductor layer of first conductivity type;

a second semiconductor layer of second conductivity type, which is arranged on the first semiconductor layer, to inject carriers of second conductivity type into the first semiconductor layer;

a third semiconductor layer of second conductivity type, which is arranged on the first semiconductor layer, to collect the carriers of second conductivity type in the first semiconductor layer from the first semiconductor layer;

a pair of trench portions extending through the third semiconductor layer and reaching the first semiconductor layer;

a pair of gate electrode portions disposed in the pair of trench portions via gate insulating films, respectively;

a pair of fourth semiconductor layer portions of first conductivity type, which are formed along the pair of trench portions, respectively, in a surface portion of the third semiconductor layer which is not interposed between the pair of trench portions, each of the fourth semiconductor layer portions being arranged to inject carriers of first conductivity type through a channel induced in the third semiconductor layer by the gate electrode portion into the first semiconductor layer and cause conductivity modulation therein;

a first main electrode disposed in contact with the second semiconductor layer;

a second main electrode disposed in contact with the third semiconductor layer and fourth semiconductor layer portions; and a fifth semiconductor layer of second conductivity type, which is formed in a non-current path region interposed between the pair of trench portions and has a resistance lower than that of the third semiconductor layer.

According to the fourth aspect of the present invention, there is provided a semiconductor device with a trench gate, comprising:

a first semiconductor layer of first conductivity type;

a second semiconductor layer of second conductivity type, which is arranged on the first semiconductor layer, to inject carriers of second conductivity type into the first semiconductor layer;

a third semiconductor layer of second conductivity type, which is arranged on the first semiconductor layer, to collect the carriers of second conductivity type in the first semiconductor layer from the first semiconductor layer;

a plurality of main trench portions extending in a first direction along a surface of the third semiconductor layer, and extending through the third semiconductor layer and reaching the first semiconductor layer in a depth direction;

a plurality of cross trench portions extending in a second direction perpendicular to the first direction along the surface of the third semiconductor layer in columns between the main trench portions, and extending through the third semiconductor layer and reaching the first semiconductor layer in a depth direction, the cross trench portions being arranged such that the columns include a column having the cross trench portions and a column having no cross trench portions;

a gate electrode disposed in each of the main and cross trench portions via a gate insulating film;

fourth semiconductor layer portions of first conductivity type, each of which is formed along the main and cross trench portions while leaving a central exposed portion of the third semiconductor layer in a surface portion of the third semiconductor layer surrounded by the main and cross trench portions, each of the fourth semiconductor layer portions being arranged to inject carriers of first conductivity type through a channel induced in the third semiconductor layer by the gate electrode into the first semiconductor layer and cause conductivity modulation therein;

a first main electrode disposed in contact with the second semiconductor layer; and a second main electrode disposed in contact with the central exposed portion of the third semiconductor layer and the fourth semiconductor layer portions.

According to the first aspect of the present invention, a semiconductor device with a trench gate is provided by forming a narrowing trench in the current path region, so that the device can increase the hole flow resistance without reducing the distance between trenches and decrease the conduction loss.

According to the second and third aspects of the present invention, a semiconductor device with a trench gate is provided by insulating and isolating the non-current path region at least in the OFF state, so that the device can reduce the gate-collector capacitance without increasing the conduction loss.

According to the fourth aspect of the present invention, a semiconductor device with a trench gate is provided by employing a ladder-shaped trench gate, so that the device can realize both the increase in channel density and promotion of conductivity modulation. Additionally, with this effect, since the interval between two ladder-shaped gate electrodes can be made large to reduce the parasitic electrostatic capacitance between the gate electrode and the main electrode, a semiconductor device with a trench gate which facilitates parallel connection can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 20A and 20B are sectional and plan views, respectively, showing a conventional IGBT with a trench gate, in which FIG. 20A shows a section taken along a line XXA—XXA in FIG. 20B;

DETAILED DESCRIPTION OF THE INVENTION

Figure 1:
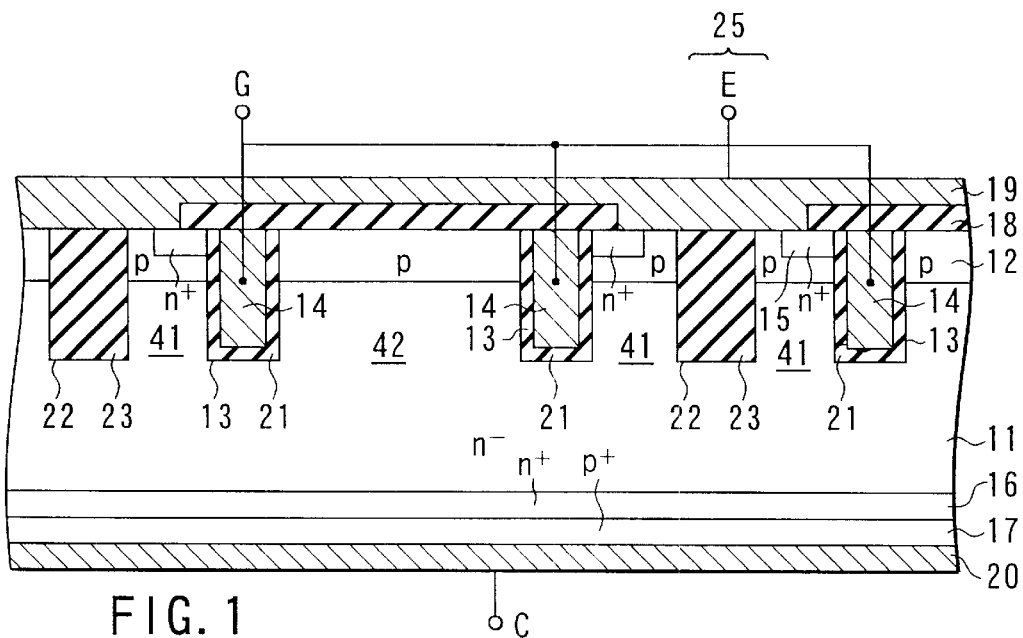
FIG. 1 is a sectional view showing the main part of an IGBT as a semiconductor device with a trench gate according to the first embodiment of the present invention.

The embodiments of the present invention will be described below with reference to the accompanying drawing. The same reference numerals denote components having almost the same functions and structures in the following description, and a repetitive description will be made only when necessary.

First Embodiment

Figure 2:
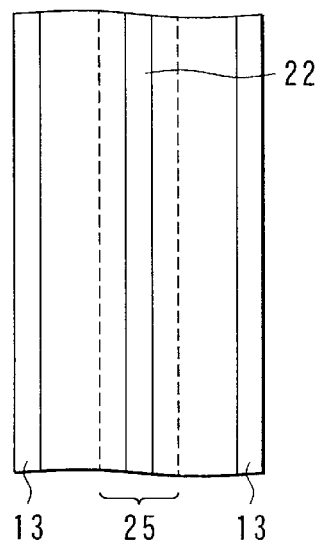
FIG. 2 is a plan view of the IGBT shown in FIG. 1.

FIG. 1 is a sectional view showing the main part of an IGBT as a semiconductor device with a trench gate according to the first embodiment of the present invention. FIG. 2 is a plan view of the IGBT shown in FIG. 1.

In this IGBT, a p-base layer 12 is formed on an in-base layer 11. A plurality of main trenches 13 are formed as stripes (FIG. 2) to extend through the p-base layer 12 from its surface and reach the n-base layer 11. In each main trench 13, a gate electrode 14 is buried via a gate insulating film 21 formed on the sidewall and bottom surface. A pair of n-emitter layer 15 are formed in the p-base layer 12 between a pair of main trenches 13 and come into contact with the main trenches 13, respectively.

An insulating film 18 is selectively formed on the p-base layer 12, n-emitter layers 15, and main trenches 13. An emitter electrode 19 is formed on the insulating film 18 and comes into contact with the n-emitter layers 15 and p-base layer 12 through contact holes. A p-emitter layer 17 is formed on the opposite-side surface of the n-base layer 11 via an n-buffer layer 16. A collector electrode 20 is further formed in contact with the p-emitter layer 17.

A region 41 between the main trenches 13 under a contact region 25 in contact with the emitter electrode 19 is used as a current path for electrons and holes flowing through the emitter electrode 19. Between the n-emitter layers 15 in the current path region 41, a narrowing trench 22 is formed to extend through the p-base layer 12 from its surface and reach the n-base layer 11. The narrowing trench 22 is used to constrict the hole current path formed from the n-base layer 11 to the emitter electrode 19 through the p-base layer 12. The narrowing trench 22 extends between a pair of main trenches 13 parallel to them (FIG. 2). An insulator 23 such as an oxide film is buried in the narrowing trench 22.

To operate this IGBT, a positive bias is applied across the collector electrode 20 and emitter electrode 19, and in this state, a positive bias is applied to the gate electrode 14. At this time, an inversion layer is formed in the p-base layer 12 along the surface of the gate insulating film 21, and electrons are injected from the n-emitter layers 15 into the n-base layer 11. On the other hand, holes are injected from the p-emitter layer 17 into the n-base layer 11 in correspondence with the injected electron amount. As the n-base layer 11 is filled with carriers, conductivity modulation occurs. For this reason, the resistance of the n-base layer 11 decreases to turn on the device.

At this time, in the n-base layer 11 in the current path region 41 connected to the emitter electrode 19 except an inversion layer, a current is generated as the holes move. When the ratio of the current path region 41 to the entire area becomes sufficiently low, the resistance in flow of the holes from the n-base layer 11 to the emitter electrode 19 increases. As a result, the holes are accumulated in the n-base layer 11 immediately under the main trenches 13, and the conduction loss of the device is reduced. A non-current path region 42, which is not connected to the emitter electrode 19, and the main trenches 13 on both sides of this region function as a whole as if a wide trench were present.

To turn off the device, a negative bias is applied to the gate electrode 14 in the ON state. The inversion layer near the interface between the p-base layer 12 and the gate insulating film 21 disappears, and electron injection from the n-emitter layers 15 into the n-base layer 11 stops. Consequently, hole injection from the p-emitter layer 17 into the n-base layer 11 stops. After that, the carriers filling the n-base layer 11 are discharged, a depletion layer spreads from the junction between the p-base layer 12 and the n-base layer 11, and the device turns off.

As described above, one factor that determines the conduction loss in the ON state is the resistance of the n-base layer 11 when conductivity modulation has occurred. The resistance of the n-base layer 11 depends on the total amount of carriers that fill this layer. The total amount of carriers is determined by the ratio of an electron current to a hole current, flowing from the n-base layer 11 to the p-base layer 12, i.e., the electron injection efficiency. In the IGBT shown in FIG. 1, since the narrowing trench 22 is formed in the current path region 41 between the main trenches 13, the resistance in flow of the holes to the emitter electrode 19 through the p-base layer 12 increases. For this reason, the electron injection efficiency increases, more holes are accumulated in the n-base layer 11, and electrons are accumulated in accordance with this hole amount. As a result, the amount of carriers filling the n-base layer 11 increases to reduce the conduction loss.

In this embodiment, to ensure contact between the p-base layer 12, the n-emitter layers 15, and the emitter electrode 19, the narrowing trench 22 must have a width smaller than that of a contact region 25. In addition, to prevent a decrease in breakdown voltage of the semiconductor device, the narrowing trench 22 preferably has a depth equal to or smaller than that of the main trench 13. Note that the above described effects are obtained in a case where current path regions 41 are arranged on both sides of each trench 13, though, in FIG. 1, the current path region 41 is arranged only on one side of each trench 13.

FIGS. 13A to 13F are sectional views showing steps in manufacturing the IGBT shown in FIG. 1.

Figure 13A:
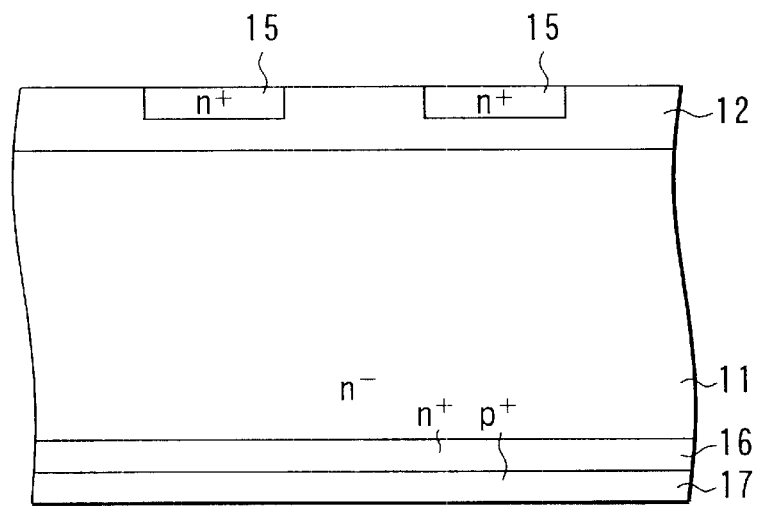
FIGS. 13A, 13B, 13C, 13D, 13E, and 13F are sectional views showing steps in manufacturing the IGBT shown in FIG. 1.

First, the n-buffer layer 16 and p-emitter layer 17 are sequentially formed on the lower surface of the n-base layer 11 by diffusion. On the other hand, the p-base layer 12 is formed on the major surface of the n-base layer 11 by diffusion. The n-emitter layers 15 are selectively formed in the p-base layer 12 by diffusion (FIG. 13A).

Figure 13B:
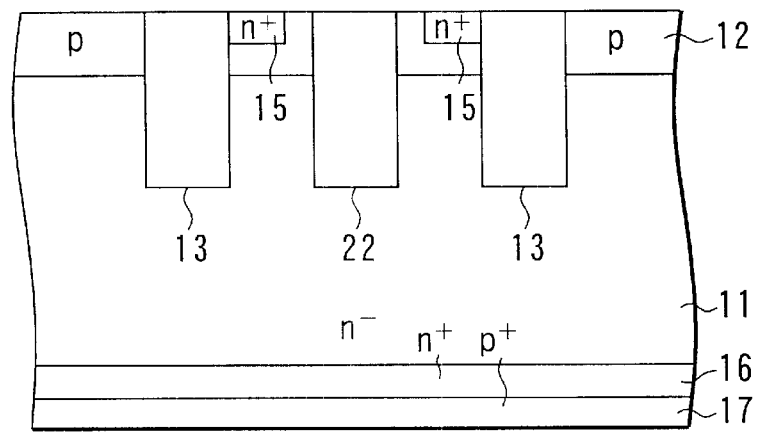
Figure 13C:
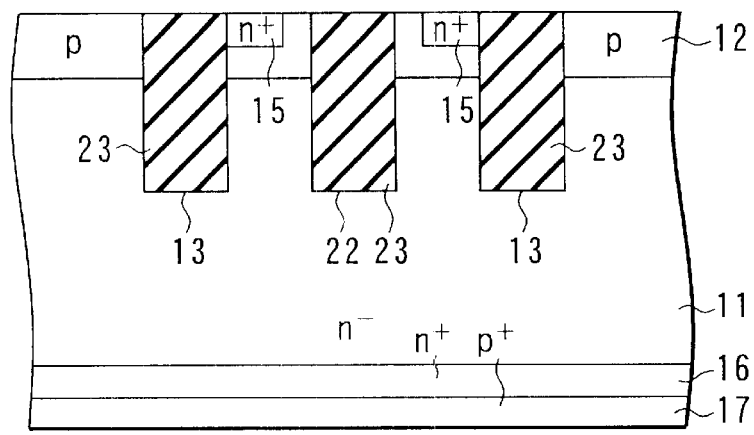

The main trenches 13 and narrowing trench 22 are formed by anisotropic etching to extend through the p-base layer 12 from its surface and reach the midway of the n-base layer 11 (FIG. 13B). A silicon oxide film is deposited and etched back to bury the insulator 23 formed from the silicon oxide film in each of the main trenches 13 and narrowing trench 22 (FIG. 13C).

A photoresist layer is selectively deposited on the narrowing trench 22 by a photoetching process. Using this photoresist layer as a mask, the silicon oxide film (insulator 23) buried in each main trench 13 is removed by wet etching.

Figure 13D:
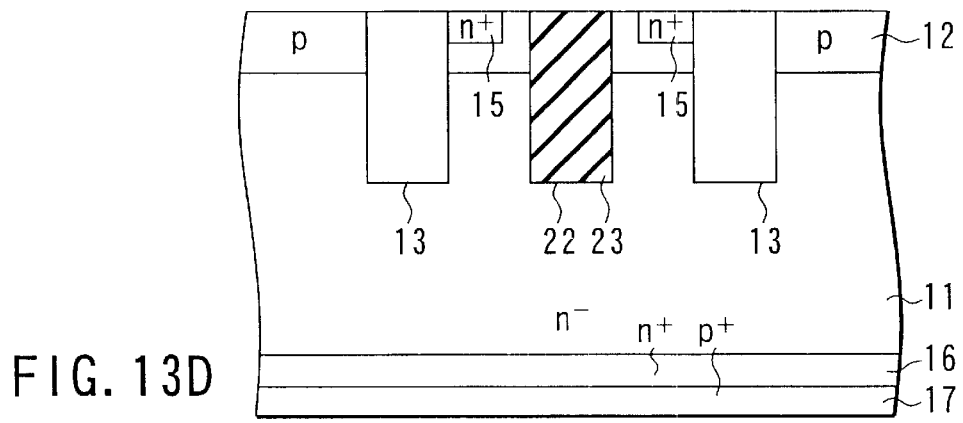

After etching, the photoresist layer is removed, thereby obtaining a structure having the insulator 23 buried only in the narrowing trench 22 (FIG. 13D).

Figure 13E:
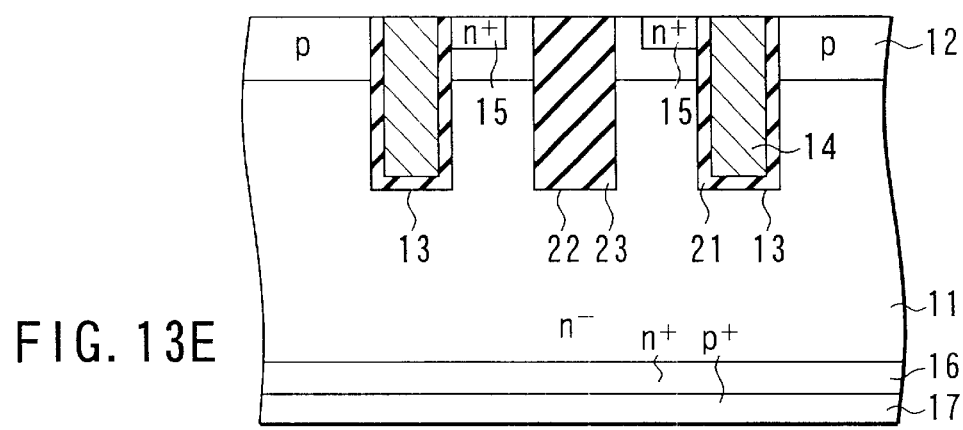

The gate insulating film 21 is formed on the inner surface of each main trench 13. A conductive film is deposited and etched back to bury the gate electrode 14 in each main trench 13 (FIG. 13E).

Figure 13F:
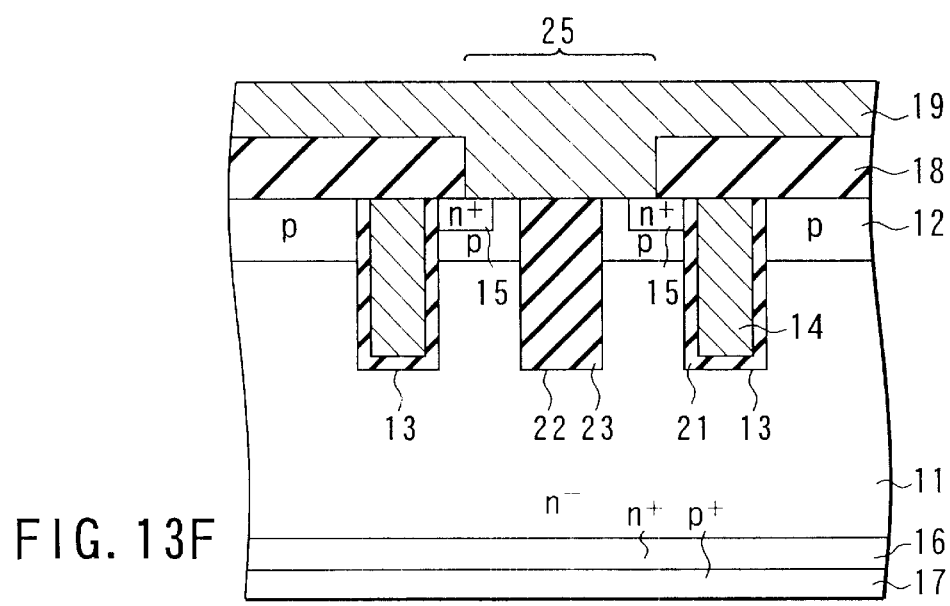

The insulating film 18 is deposited and selectively removed in the contact region 25 between the main trenches 13 (on and near the narrowing trench 22). The emitter electrode 19 is formed on the insulating film 18 and contact region 25 so as to be in contact with the p-base layer 12 and n-emitter layers 15 (FIG. 13F).

Figure 3:
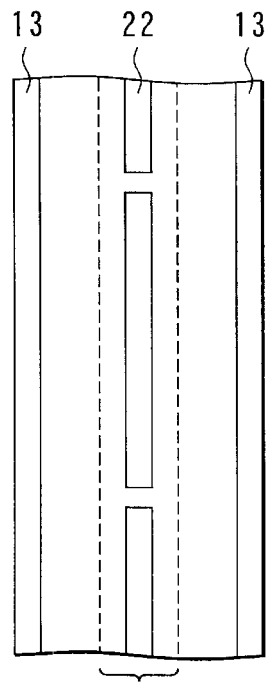
FIG. 3 is a plan view showing the main part of an IGBT according to a modification of the first embodiment.

FIG. 3 is a plan view showing the main part of an IGBT according to a modification of the first embodiment.

In this modification, the narrowing trench 22 is shorter than the main trench 13 and breaks at some positions. This structure can ensure the contact between the p-base layer 12, the n-emitter layers 15, and emitter electrode 19. When the length of the narrowing trench 22 is set to be almost equal to or smaller than the diffusion length of holes (100 μm in this embodiment) in the n-base layer 11, the latching current of the semiconductor device can be increased.

The same modification as in FIG. 3 can also be applied to the third to sixth embodiments to be described later.

Second Embodiment

Figure 4:
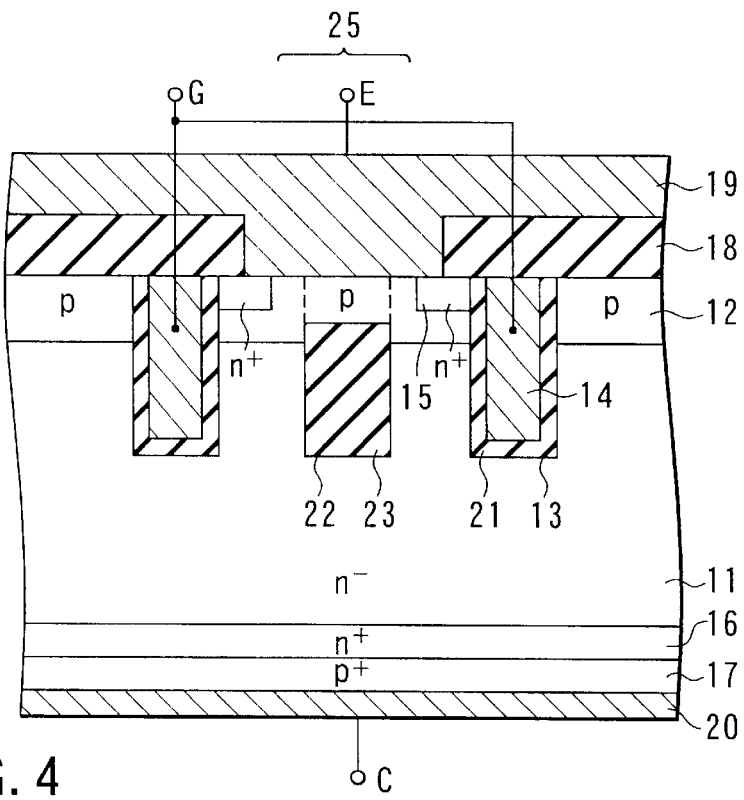
FIG. 4 is a sectional view showing the main part of an IGBT as a semiconductor device with a trench gate according to the second embodiment of the present invention.

FIG. 4 is a sectional view showing the main part of an IGBT as a semiconductor device with a trench gate according to the second embodiment of the present invention.

The IGBT shown in FIG. 4 is different from the IGBT shown in FIG. 1 in that a narrowing trench 22 filled with an insulator 23 is not exposed to the surface of a p-base layer 12. Even this structure can obtain the same effect as in the first embodiment. Additionally, since the narrowing trench 22 is not exposed in a contact region 25, the contact resistance can be made low. Furthermore, the latching current can be increased.

Third Embodiment

Figure 5:
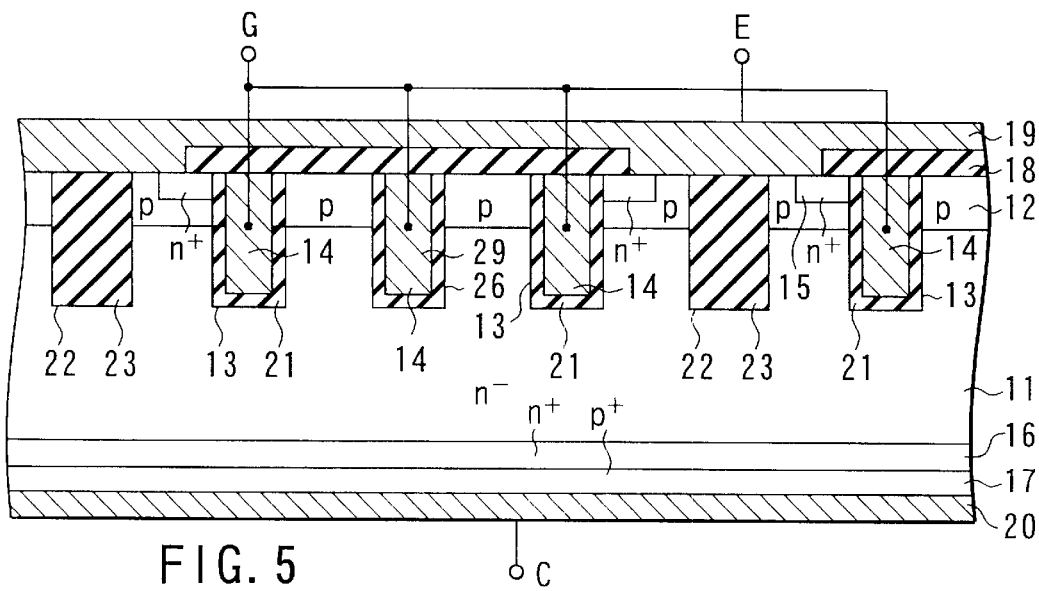
FIG. 5 is a sectional view showing the main part of an IGBT as a semiconductor device with a trench gate according to the third embodiment of the present invention.

FIG. 5 is a sectional view showing the main part of an IGBT as a semiconductor device with a trench gate according to the third embodiment of the present invention.

The IGBT shown in FIG. 5 is different from the IGBT shown in FIG. 1 in that a dummy trench 26 is formed between main trenches 13, which has almost the same shape as the main trench 13 and extends in the same direction as the main trench 13. The dummy trench 26 is formed to prevent the breakdown voltage of the device from decreasing due to an increase in distance between two current path regions 41 (contact regions 25). Hence, the dummy trench 26 preferably has the same depth as that of the main trench 13. The number of dummy trenches 26 is not limited to one. When the number of dummy trenches 26 inserted is increased along with an increase in distance between the main trenches 13, any decrease in breakdown voltage of the device can be prevented.

The semiconductor region between the dummy trench 26 and the main trenches 13 is covered with an insulating film 18. Hence, in this region, a p-base layer 12 does not come into contact with an emitter electrode 19. For this reason, the contact area between the emitter electrode 19 and the p-base layer 12 further decreases, so larger conductivity modulation can be realized.

Figure 6:
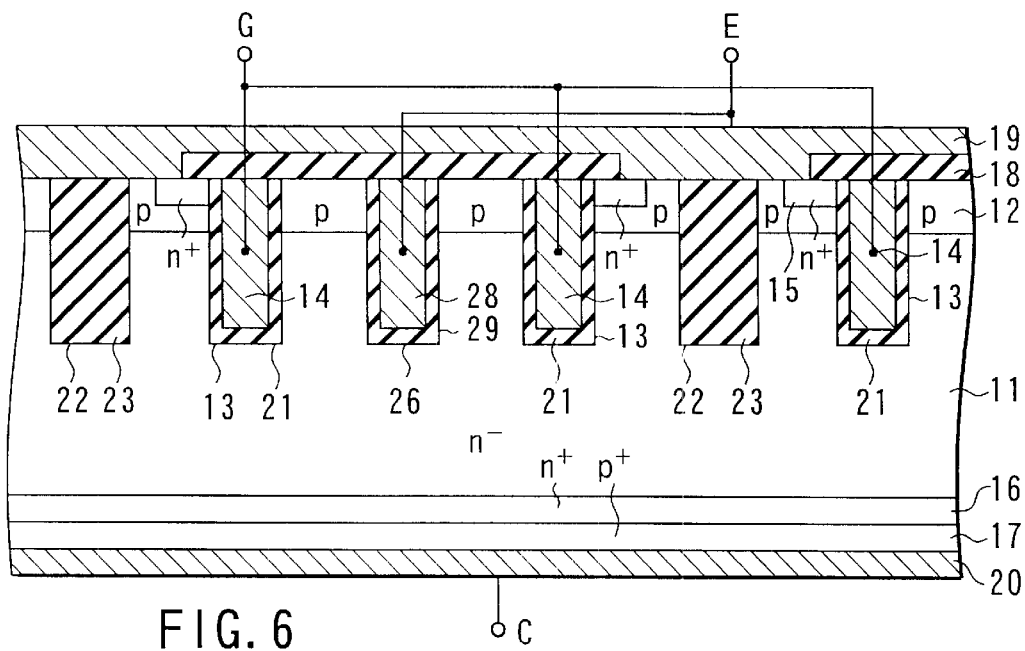
FIG. 6 is a sectional view showing the main part of an IGBT according to a modification of the third embodiment.

FIG. 6 is a sectional view showing the main part of an IGBT according to a modification of the third embodiment.

In this modification, a conductor 28 is buried in the dummy trench 26 via an insulating film 29 in the same process as that for a gate electrode 14. The conductor 28 is connected to the emitter electrode 19. Since this structure can stabilize the potential of the conductor 28 and also reduce the input capacitance of the gate electrode 14, the operation speed of the device can be increased.

The structures including the dummy trench 26 shown in FIGS. 5 and 6 can also be applied to the fourth to sixth embodiments to be described below.

Fourth Embodiment

Figure 7:
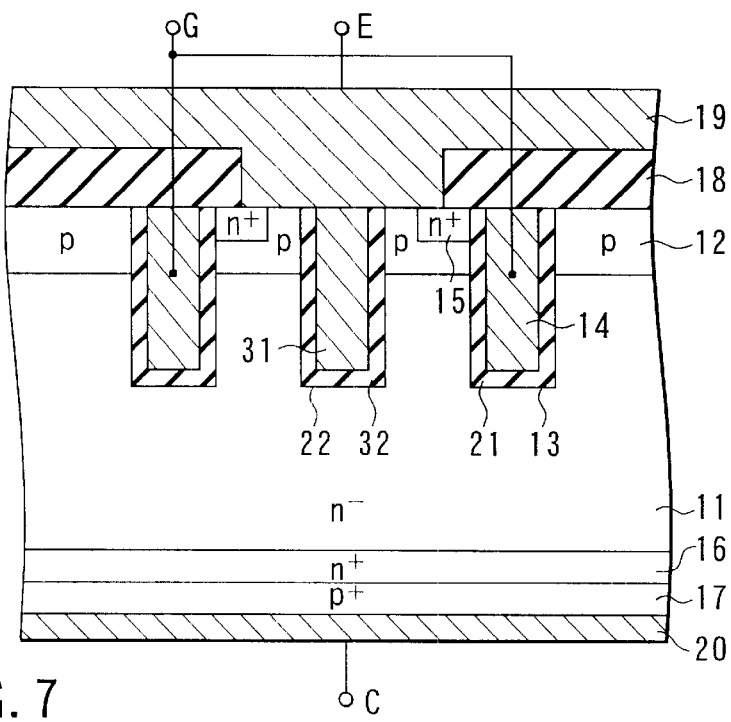
FIG. 7 is a sectional view showing the main part of an IGBT as a semiconductor device with a trench gate according to the fourth embodiment of the present invention.

FIG. 7 is a sectional view showing the main part of an IGBT as a semiconductor device with a trench gate according to the fourth embodiment of the present invention.

The IGBT shown in FIG. 7 is different from the IGBT shown in FIG. 1 in that a conductor 31 is buried in a narrowing trench 22 via an insulating film 32 in the same process as that for a gate electrode 14 so as to come into contact with an emitter electrode 19. The conductor 31 need not always be connected to the emitter electrode 19. When connected, however, both the potential and the device operation are stabilized.

Even this structure can also obtain the same effect as in the first embodiment. In addition, when the conductor 31 is made of a material such as p-polysilicon having a large work function with respect to an n-base layer 11, a depletion layer is formed on the sidewall and bottom surface of the narrowing trench 22. This prevents a decrease in number of carriers due to surface recombination at the interface of the narrowing trench 22.

Figure 14A:
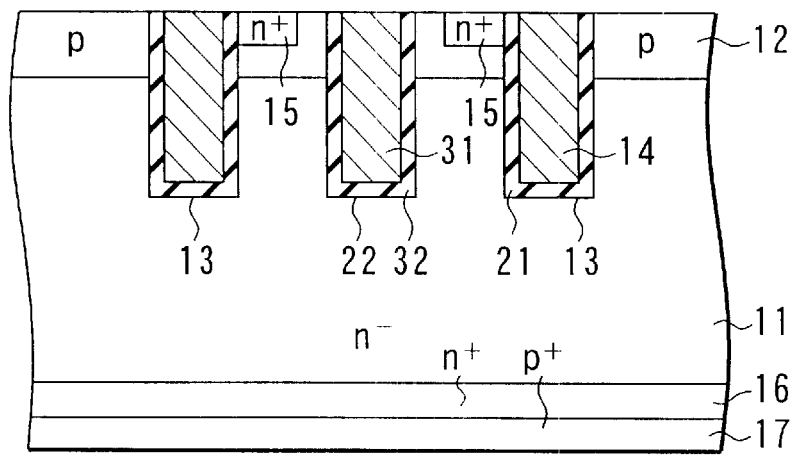
FIGS. 14A and 14B are sectional views showing steps in manufacturing the IGBT shown in FIG. 7.
Figure 14B:
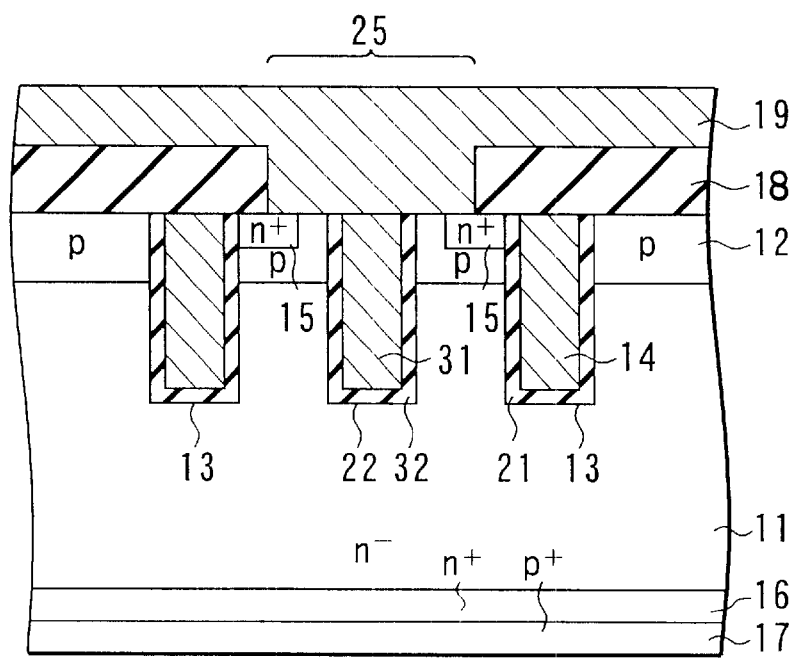

FIGS. 14A and 14B are sectional views showing steps in manufacturing the IGBT shown in FIG. 7.

First, the structure shown in FIG. 13B, which has the main trenches 13 and narrowing trench 22, is formed according to the same procedures as described with reference to FIGS. 13A and 13B. Next, a gate insulating film 21 and insulating film 32 are formed on the inner surfaces of the main trenches 13 and narrowing trench 22, respectively. A conductive film is deposited and etched back to bury the gate electrodes 14 and conductor 31 in the main trenches 13 and narrowing trench 22, respectively (FIG. 14A).

An insulating film 18 is deposited and selectively removed in a contact region 25 between the main trenches 13 (on and near the narrowing trench 22). The emitter electrode 19 is formed on the insulating film 18 and contact region 25 so as to be in contact with a p-base layer 12, n-emitter layers 15, and conductor 31 (FIG. 14B).

Fifth Embodiment

Figure 8:
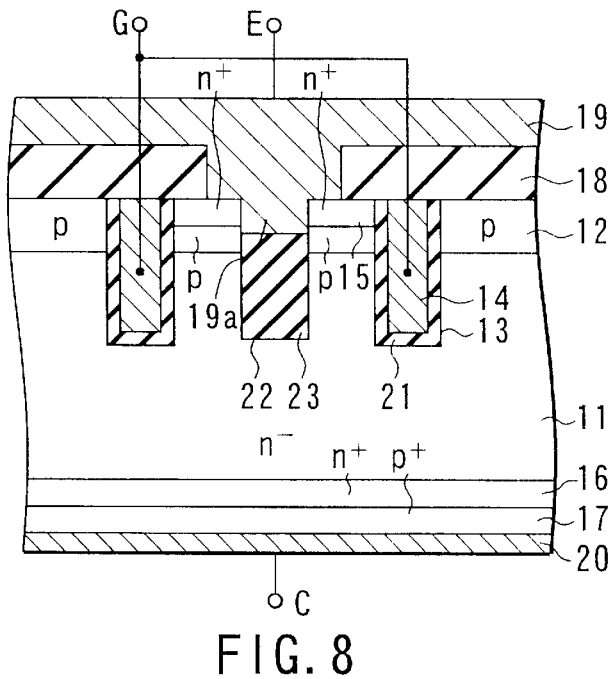
FIG. 8 is a sectional view showing the main part of an IGBT as a semiconductor device with a trench gate according to the fifth embodiment of the present invention.

FIG. 8 is a sectional view showing the main part of an IGBT as a semiconductor device with a trench gate according to the fifth embodiment of the present invention.

The IGBT shown in FIG. 8 is different from the IGBT shown in FIG. 1 in that an insulator 23 is buried halfway from the bottom in a narrowing trench 22, and an extended portion 19a of an emitter electrode 19 is inserted into the upper portion of the narrowing trench 22. N-emitter layers 15 cover the entire surface of a p-base layer 12 between main trenches 13 and the narrowing trench 22. The emitter electrode 19 is in contact with the p-base layer 12 through the extended portion 19a.

Even this structure can also obtain the same effect as in the first embodiment. The narrowing trench 22 may be wider at a portion corresponding to the extended portion 19a of the emitter electrode 19 than at a portion where the insulator 23 is buried. The emitter electrode 19 is in contact with the n-emitter layers 15 and p-base layer 12 at the sidewall of the narrowing trench 22. For this reason, even when misalignment occurs between the trench mask and the contact mask, the emitter electrode 19, n-emitter layers 15, and p-base layer 12 can be surely brought into contact with each other.

The n-emitter layer 15 may be formed selectively on the surface of the p-base layer 12. With this arrangement, the channel density can decrease to reduce the saturation current. As a result, it is possible to improve the short circuit ruggedness to be caused in the device.

Figure 15A:
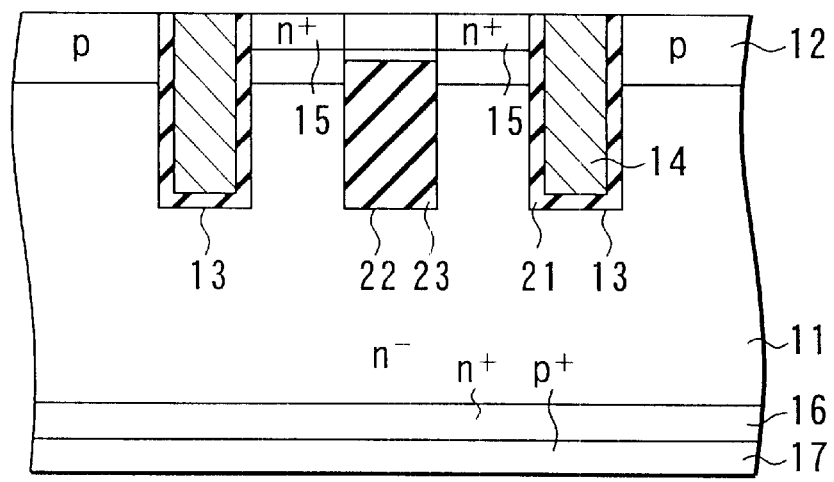
FIGS. 15A and 15B are sectional views showing steps in manufacturing the IGBT shown in FIG. 8.
Figure 15B:
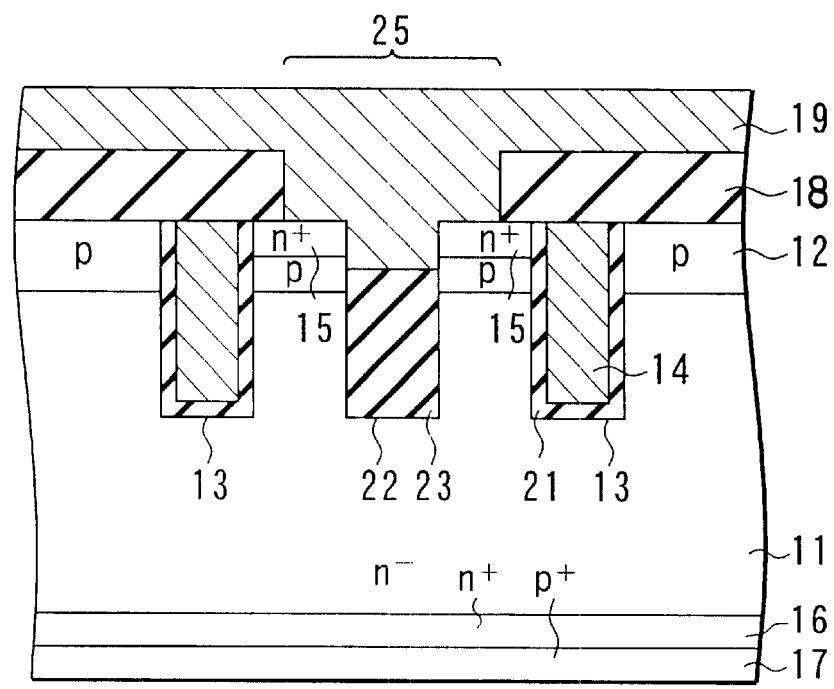

FIGS. 15A and 15B are sectional views showing steps in manufacturing the IGBT shown in FIG. 8.

First, a structure similar to that shown in FIG. 13E, which has the main trenches 13 each having a gate electrode 14 buried and the narrowing trench 22 having the insulator 23 buried, is formed according to the same procedures as described with reference to FIGS. 13A to 13E. Next, the insulating film 32 formed from a silicon oxide film is removed by etching to a depth halfway through the p-base layer 12 (FIG. 15A).

An insulating film 18 is deposited and selectively removed in a contact region 25 between the main trenches 13 (on and near the narrowing trench 22). The emitter electrode 19 is formed on the insulating film 18 and contact region 25 so as to be in contact with the p-base layer 12 and n-emitter layers 15 (FIG. 15B).

Sixth Embodiment

Figure 9:
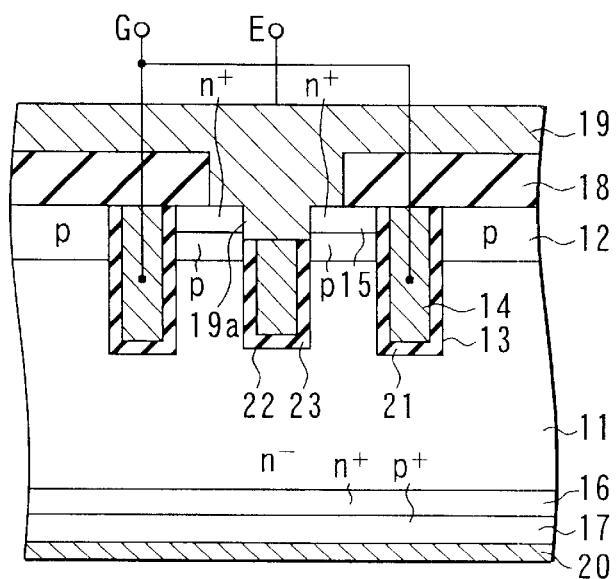
FIG. 9 is a sectional view showing the main part of an IGBT as a semiconductor device with a trench gate according to the sixth embodiment of the present invention.

FIG. 9 is a sectional view showing the main part of an IGBT as a semiconductor device with a trench gate according to the sixth embodiment of the present invention.

The IGBT shown in FIG. 9 is different from the IGBT shown in FIG. 8 in that a conductor 31 is buried halfway from the bottom in a narrowing trench 22 via an insulating film 32 in the same step as that for a gate electrode 14 so as to come into contact with an extended portion 19a of an emitter electrode 19. The conductor 31 need not always be connected to the emitter electrode 19. When connected, however, both the potential and the device operation are stabilized.

This structure can provide both effects of the fourth and fifth embodiments. The narrowing trench 22 may be wider at a portion corresponding to the extended portion 19a of the emitter electrode 19 than at a portion where the insulator 23 is buried. In addition, when the conductor 31 is made of a material such as p-polysilicon having a large work function with respect to an n-base layer 11, a depletion layer is formed on the sidewall and bottom surface of the narrowing trench 22. This prevents a decrease in number of carriers due to surface recombination at the interface of the narrowing trench 22.

Figure 16A:
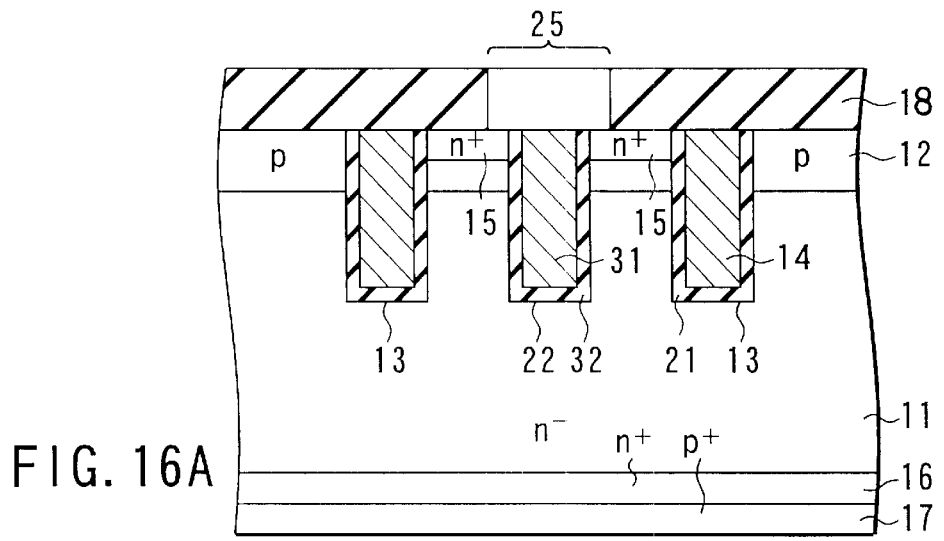
FIGS. 16A, 16B, and 16C are sectional views showing steps in manufacturing the IGBT shown in FIG. 9.
Figure 16B:
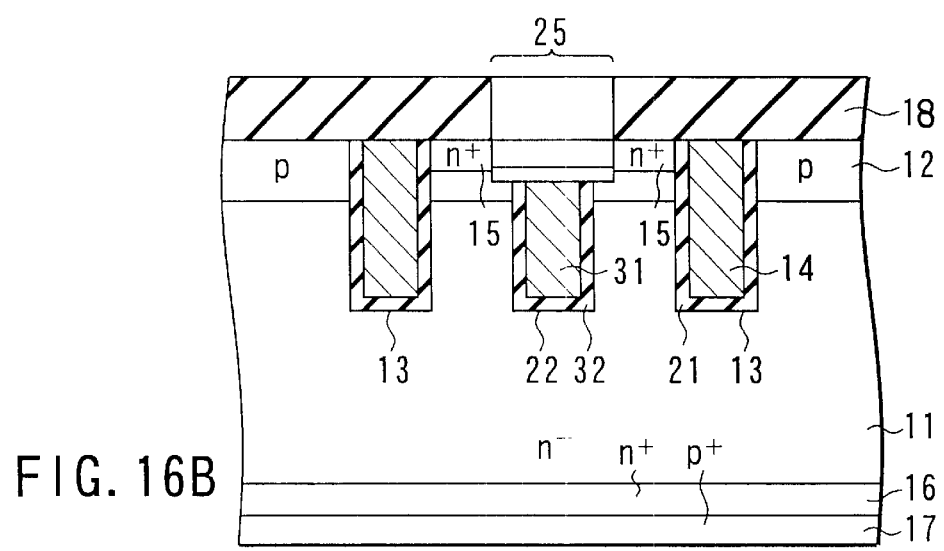
Figure 16C:
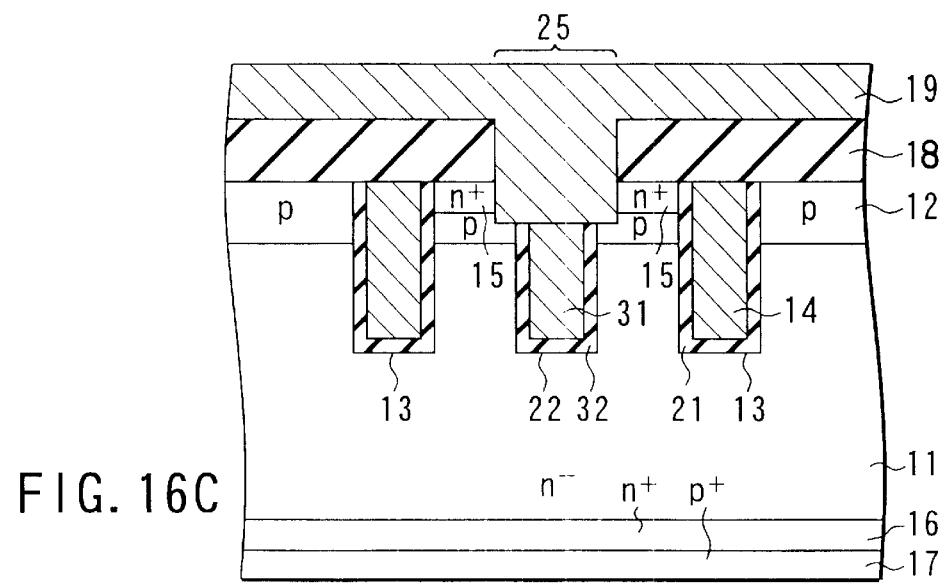

FIGS. 16A to 16C are sectional views showing steps in manufacturing the IGBT shown in FIG. 9. Although the shape of the extended portion 19a of the emitter electrode 19 formed according to these procedures is slightly different from that in the IGBT shown in FIG. 9, the structural feature is basically the same.

First, a structure similar to that shown in FIG. 14A, which has main trenches 13 each having the gate electrode 14 buried and the narrowing trench 22 having conductor 31 buried, is formed according to the same procedures as described with reference to FIGS. 13A and 13B and FIG. 14A.

An insulating film 18 is deposited and selectively removed in the contact region 25 between the main trenches 13 (on and near the narrowing trench 22) (FIG. 16A). Using the insulating film 18 as a mask, the narrowing trench 22 and the substrate portion around the narrowing trench 22 are etched to a depth halfway through the p-base layer 12 (FIG. 16B). The emitter electrode 19 is formed on the insulating film 18 and contact region 25 so as to be in contact with the p-base layer 12, n-emitter layers 15, and conductor 31 (FIG. 16C).

Seventh Embodiment

Figure 10:
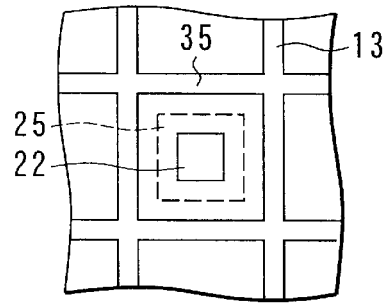
FIG. 10 is a plan view showing the main part of an IGBT as a semiconductor device with a trench gate according to the seventh embodiment of the present invention.

FIG. 10 is a plan view showing the main part of an IGBT as a semiconductor device with a trench gate according to the seventh embodiment of the present invention.

The IGBT shown in FIG. 10 is different from the IGBT shown in FIG. 2 in that a main trench 13 having not a stripe structure but a rectangular mesh structure is formed. Referring to FIG. 10, a section taken along a line parallel to the main trench 13 and crossing a narrowing trench 22 is the same as in FIG. 1. More specifically, the pair of main trenches 13 shown in FIG. 1 correspond to portions opposing each other in a single looped trench 35 which forms one cell of the mesh.

Even this structure can produce the same effect as in the first embodiment because the narrowing trench 22 increases the hole current resistance. Additionally, in this embodiment, since the channel width increases due to the main trench 13 having a mesh structure, the conduction loss of the semiconductor device can be further reduced.

Figure 11:
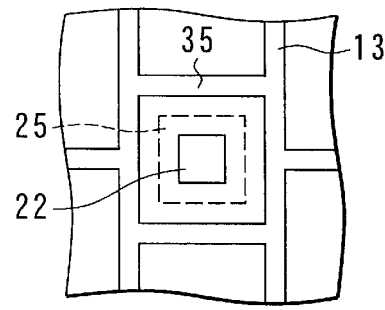
FIG. 11 is a plan view showing the main part of an IGBT according to a modification of the seventh embodiment.
Figure 12:
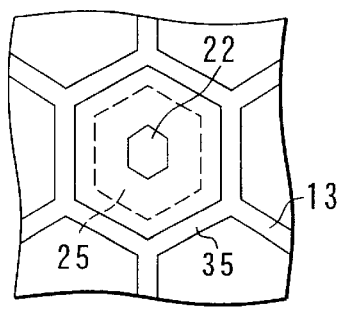
FIG. 12 is a plan view showing the main part of an IGBT according to another modification of the seventh embodiment.

FIGS. 11 and 12 are plan views showing the main parts of IGBTs according to modifications to the seventh embodiment.

In the modification shown in FIG. 11, a plurality of looped trenches 35 constructing the main trench 13 are alternately shifted by a half pitch. Even this structure can obtain the same effect as that of the IGBT shown in FIG. 10. The mesh structure of the main trench 13 shown in FIG. 11 is easier to form than that shown in FIG. 10.

In the modification shown in FIG. 12, the main trench 13 has a honeycomb structure. Even this structure can provide the same effects as in the IGBT shown in FIG. 10: an increase in hole current resistance and an increase in channel width.

The structure of the seventh embodiment can be applied not only to the sectional structure shown in FIG. 1 but also to any one of the sectional structures shown in FIGS. 4 to 9.

Eighth Embodiment

Figure 17:
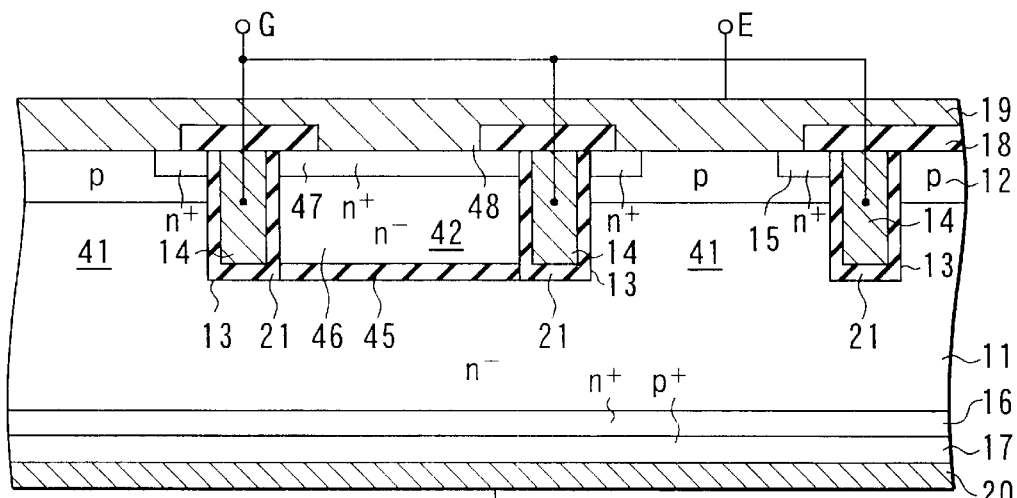
FIG. 17 is a sectional view showing the main part of an IGBT as a semiconductor device with a trench gate according to the eighth embodiment of the present invention.

FIG. 17 is a sectional view showing the main part of an IGBT as a semiconductor device with e trench gate according to the eighth embodiment of the present invention.

The above-described first to seventh embodiments are related to an improvement in the current path region 41 between the pair of main trenches 13, which serves as a current path in the ON state of the device. However, the eighth embodiment is related to an improvement in a non-current path region 42, which does not serve as a current path in the ON state of the device.

In the IGBT shown in FIG. 17, in the non-current path region 42 between a pair of main trenches 13, an isolation insulating layer 45 horizontally extends at a depth near the bottom portions of the main trenches 13. The isolation insulating layer 45 is formed between the pair of main trenches 13 so as to completely close the non-current path region 42 and isolate an n-semiconductor layer 46 in the non-current path region 42 from an n-base layer 11. An n-contact layer 47 is formed on the surface of the n-semiconductor layer 46. An electrode 48 is formed in contact with the n-contact layer 47. The electrode 48 is electrically connected to an emitter electrode 19.

The isolation insulating layer 45 can be formed as a silicon oxide film by implanting, e.g., oxygen ions to a predetermined depth in the silicon substrate and annealing the resultant structure. The isolation insulating layer 45 may be a cavity layer. A method of forming such a cavity layer is disclosed in, e.g., T. Sato et al., IEDM Tech. Dig., p. 517, 1999, and the entire contents of which are incorporated herein by reference.

In the eighth embodiment having this structure, since the n-base layer 11 is insulated and isolated from the n-semiconductor layers 46 and 47 by the isolation insulating layer 45, holes flow only through a current path region 41 in the ON state of the device. Hence, when the non-current path region 42 is made sufficiently large, the hole current resistance can be increased, and the conduction loss can be reduced.

In addition, since the n-base layer 11 is insulated and isolated from the n-semiconductor layers 46 and 47, the portion of a gate insulating film 21 in contact with the non-current path region 42 does not contribute to the gate-collector capacitance. Hence, the gate-collector capacitance is reduced, so that the mirror period is shortened, and the energy loss in turning off can be decreased.

Furthermore, since the n-semiconductor layers 46 and 47 are electrically connected to the emitter electrode 19, a floating state can be prevented. Also, when the electrode 48 is formed, the non-current path region 42 surely contributes not to the gate-collector capacitance but to the gate-emitter capacitance.

Ninth Embodiment

Figure 18:
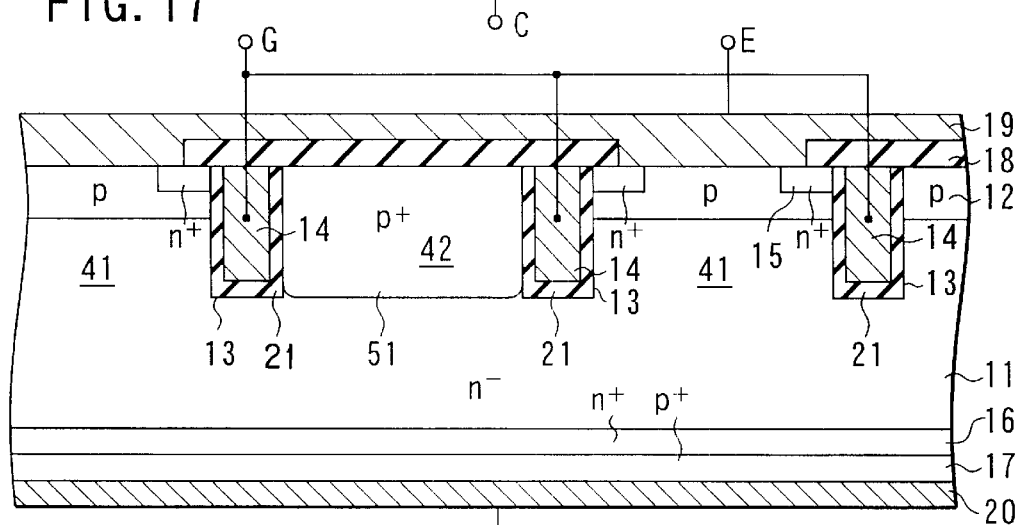
FIG. 18 is a sectional view showing the main part of an IGBT as a semiconductor device with a trench gate according to the ninth embodiment of the present invention.

FIG. 18 is a sectional view showing the main part of an IGBT as a semiconductor device with a trench gate according to the ninth embodiment of the present invention. The ninth embodiment is also related to an improvement in a non-current path region 42 which does not serve as a current path in the ON state of the device.

In the IGBT shown in FIG. 18, a p-guard layer 51 having a lower resistance (higher carrier impurity concentration) than that of a p-base layer 12 is formed in the non-current path region 42 between a pair of main trenches 13. The p-guard layer 51 is formed from the substrate surface to a depth near the bottom portions of the main trenches 13 by diffusing an impurity so as to occupy almost the entire non-current path region 42.

In the ninth embodiment having this structure, holes flow not through the non-current path region 42 occupied by the p-guard layer 51 but only through a current path region 41 in the ON state of the device. Hence, when the non-current path region 42 is made sufficiently large, the hole current resistance can be increased, and the conduction loss can be reduced.

In turning off, a depletion layer is mainly formed on an n-base layer 11 side from the junction between the p-guard layer 51 and the n-base layer 11, so the p-guard layer 51 is insulated and isolated from the n-base layer 11. For this reason, in turning off, the portion of a gate insulating film 21 in contact with the non-current path region 42 does not contribute to the gate-collector capacitance. Hence, the gate-collector capacitance is reduced, so that the mirror period is shortened, and the energy loss in turning off can be decreased.

Tenth Embodiment

Figure 19:
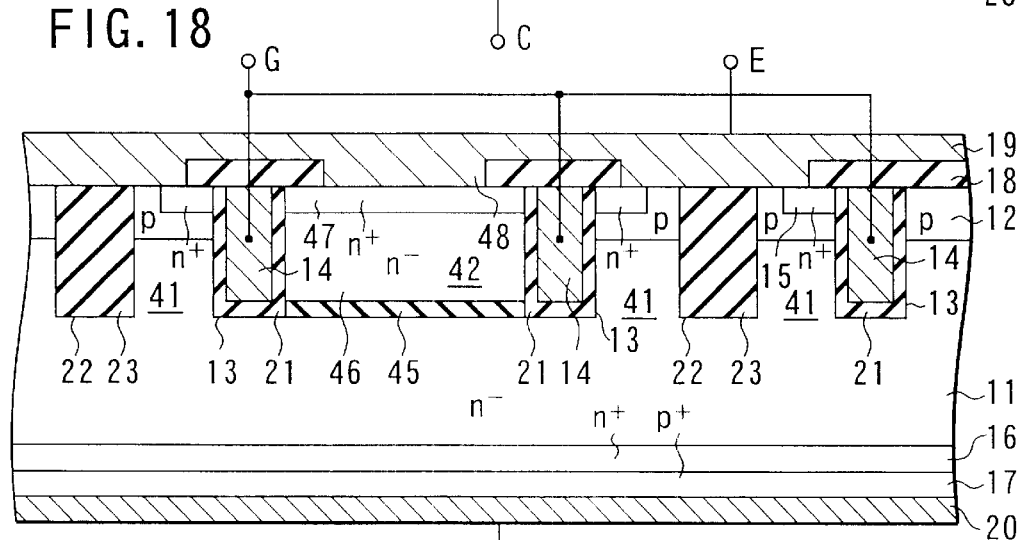
FIG. 19 is a sectional view showing the main part of an IGBT as a semiconductor device with a trench gate according to the 10th embodiment of the present invention.

FIG. 19 is a sectional view showing the main part of an IGBT as a semiconductor device with a trench gate according to the 10th embodiment of the present invention.

The IGBT shown in FIG. 19 has a narrowing trench 22 formed in a current path region 41, which is the characteristic feature of the IGBT shown in FIG. 1, and an isolation insulating layer 45 formed in a non-current path region 42, which is the characteristic feature of the IGBT shown in FIG. 18. With this structure, an IGBT capable of realizing both effects described about the two IGBTs shown in FIGS. 1 and 18, i.e., a decrease in conduction loss and a decrease in gate-collector capacitance can be provided. As described above, the improvement in the non-current path region 42 in each of the eighth and ninth embodiments can be combined with the improvement in the current path region 41 in each of the first to seventh embodiments.

Eleventh Embodiment

Figure 21:
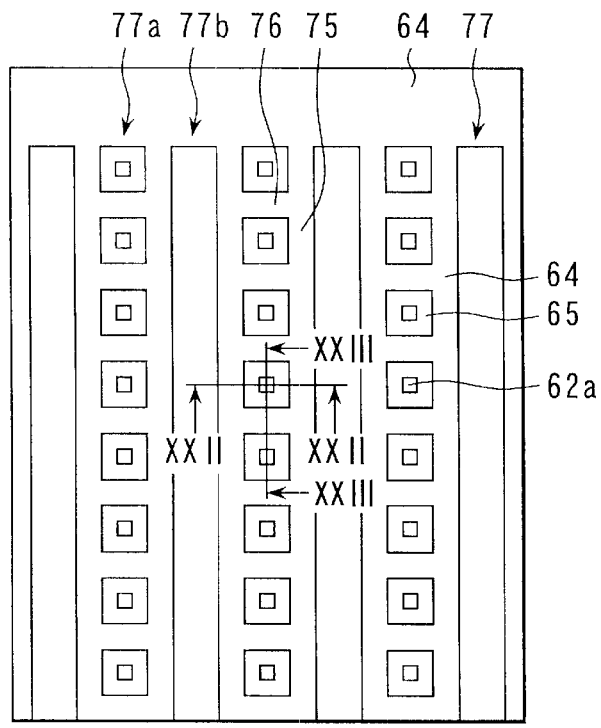
FIG. 21 is a plan view showing the main part of an IGBT as a semiconductor device with a trench gate according to the 11th embodiment of the present invention.
Figure 22:
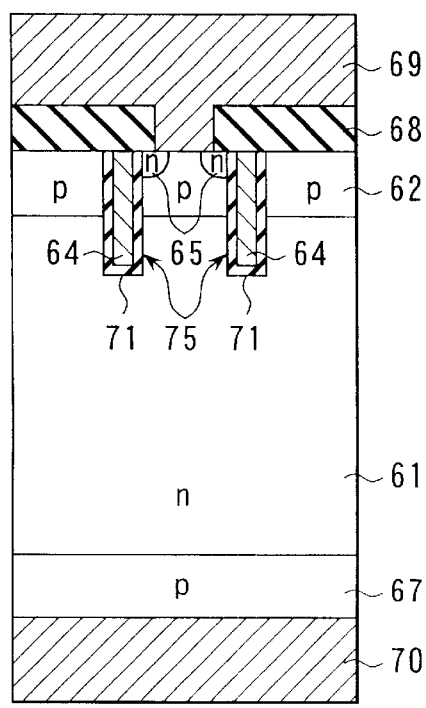
FIG. 22 is a sectional view taken along a line XXII—XXII in FIG. 21.
Figure 23:
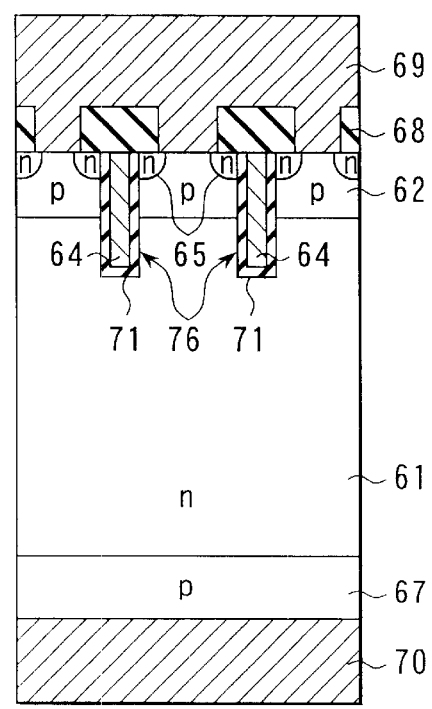
FIG. 23 is a sectional view taken along a line XXIII—XXIII in FIG. 21.

FIG. 21 is a plan view showing the main part of an IGBT as a semiconductor device with a trench gate according to the 11th embodiment of the present invention. FIGS. 22 and 23 are sectional views taken along a line XXII—XXII and a line XXIII—XXIII in FIG. 21, respectively.

In this IGBT, a p-base layer 62 is formed on an n-base layer 61. Main trenches 75 and cross trenches 76 are formed to extend through the p-base layer 62 from its surface and reach the n-base layer 61. A gate electrode 64 is buried in each of the trenches 75 and 76 via a gate insulating film 71 formed on the sidewall and bottom surface. N-emitter layers 65 are formed in the p-base layer 62 to come into contact with the trenches 75 and 76.

An insulating film 68 is selectively formed on the p-base layer 62, n-emitter layers 65, and trenches 75 and 76. An emitter electrode 69 is formed on the insulating film 68 to come into contact with the n-emitter layers 65 and p-base layer 62 through contact holes. A p-emitter layer 67 is formed on the opposite-side surface of the n-base layer 61. A collector electrode 70 is formed in contact with the p-emitter layer.

As shown in the plan view of the device shown in FIG. 21, a plurality of main trenches 75 extend in the Y direction while a plurality of cross trenches 76 extend in the X direction perpendicular to the Y direction in columns 77 between the main trenches 75. The columns 77 between the main trenches 75 are set m such that columns 77a having the cross trenches 76 and columns 77b having no cross trenches 76 alternate. For this reason, in the plan view of the device, the main trenches 75 and cross trenches 76 form a layout as if a plurality of ladder-shaped trenches were arranged at given intervals.

Each n-emitter layer 65 is formed along the main and cross trenches 75 and 76 while leaving a central exposed portion 62a of the p-base layer 62 on its surface at a portion surrounded by the main and cross trenches 75 and 76. The contact holes in the insulating film 68 are formed in correspondence with the portions of the p-base layer 62, which are surrounded by the main and cross trenches 75 and 76. Hence, the emitter electrode 69 comes, through the contact hole, into contact with the exposed surface of each n-emitter layer 65 having a rectangular ring shape and the central exposed portion 62a of the p-base layer 62 surrounded by the n-emitter layer 65.

The ON/OFF operation of this IGBT is the same as that of the IGBT according to each of the first to 10th embodiments described with reference to FIGS. 1 to 19, and a detailed description thereof will be omitted.

In the IGBT shown in FIGS. 21 to 23, since the trenches 75 and 76 have a ladder structure, i.e., the gate electrode 64 has a ladder structure, the channel density can be increased. In addition, the area of the p-base layer 62 surrounded by the trenches 75 and 76 having a ladder shape to come into contact with the emitter electrode 69 becomes small. For this reason, holes injected from the collector electrode 70 hardly flow from the n-base layer 61, so large conductivity modulation is obtained in the n-base layer 61. Hence, both the channel resistance and the resistance of the n-base layer are reduced, and the conduction loss of the entire device can be decreased.

Twelfth Embodiment

Figure 24:
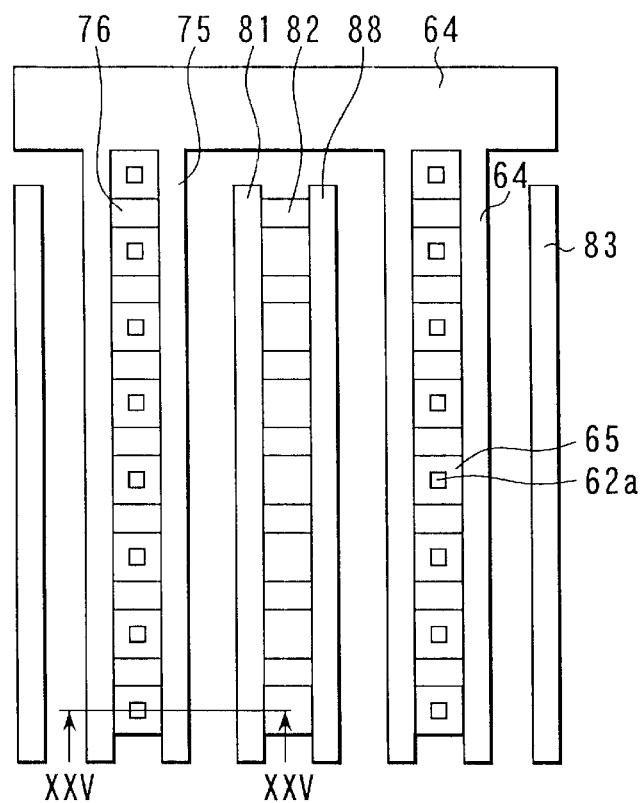
FIG. 24 is a plan view showing the main part of an IGBT as a semiconductor device with a trench gate according to the 12th embodiment of the present invention.
Figure 25:
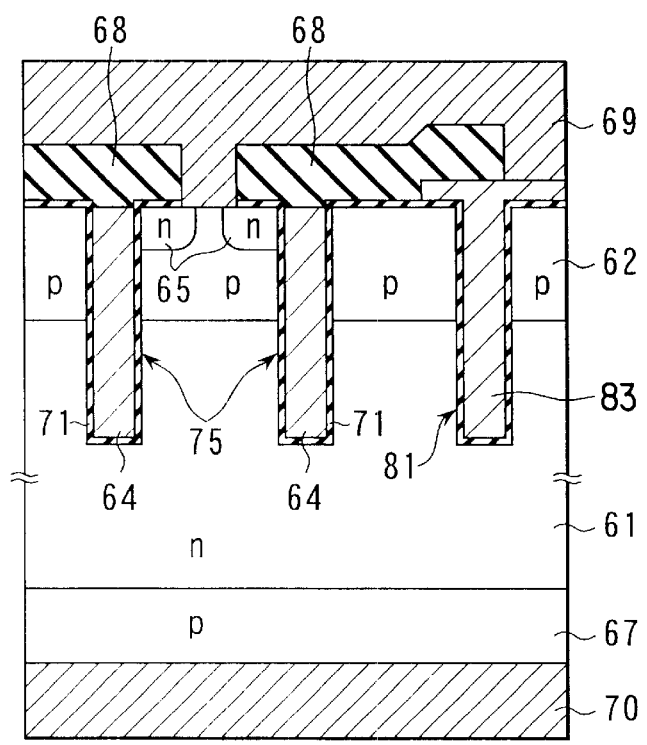
FIG. 25 is a sectional view taken along a line XXV—XXV in FIG. 24.

FIG. 24 is a plan view showing the main part of an IGBT as a semiconductor device with a trench gate according to the 12th embodiment of the present invention. FIG. 25 is a sectional view taken along a line XXV—XXV in FIG. 24.

The IGBT shown in FIGS. 24 and 25 is different from the IGBT shown in FIGS. 21 to 23 in that two main dummy trenches 81 are formed between main trenches 75, each of which has almost the same shape as the main trench 75 and extends in the same direction as the main trench 75. In other words, of the main trenches 75 shown in FIG. 21, trenches used to form ladder-shape gate electrodes 64 have a lower density. Cross dummy trenches 82 are formed between two main dummy trenches 81 in the same form as cross trenches 76.

Figure 20A:
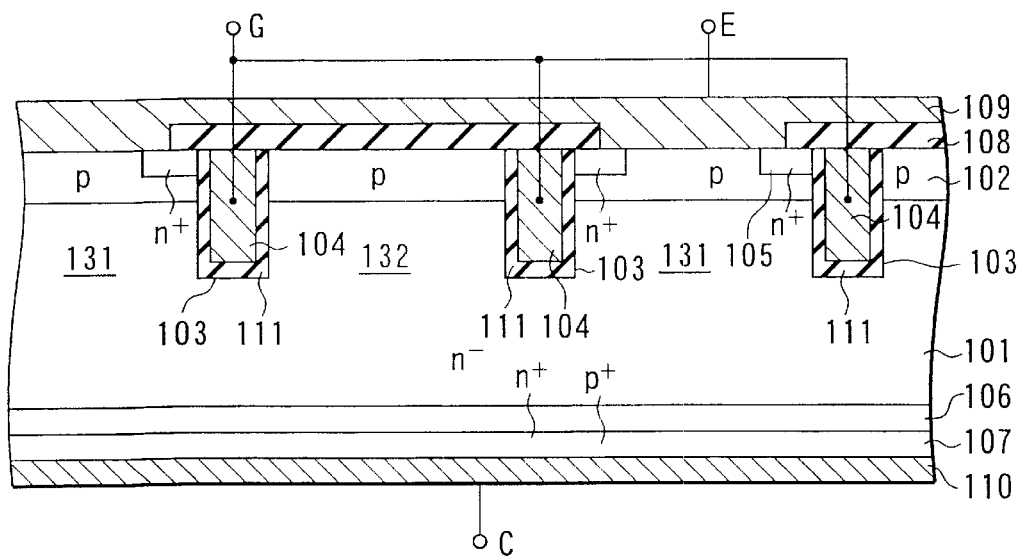
Figure 20B:
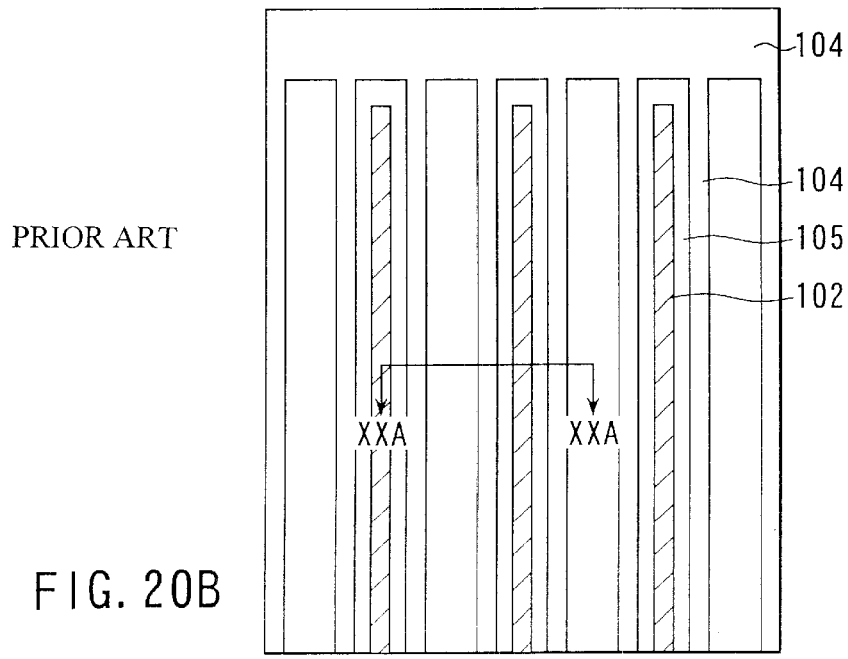

In the present invention, the channel density associated with one ladder-shaped gate electrode 64 is higher than that of the conventional two gate electrodes 104 having a stripe structure (FIG. 20B). For this reason, the number of stripes of the gate electrodes can be made smaller than the conventional structure without increasing the channel conductance. Since the number of stripes of the gate electrodes can be made small to reduce the parasitic electrostatic capacitance between the gate electrode and the main electrode, nonuniform operation or oscillation phenomenon between devices connected in parallel is suppressed.

A conductor 83 is buried in each of the dummy trenches 81 and 82 via an insulating film in the same process as that for the gate electrode 64 and connected to an emitter electrode 69. The conductor 83 need not always be connected to the emitter electrode 69. When connected, however, both the potential and the device operation are stabilized.

The region surrounded by the dummy trenches 81 and 82 is covered with an insulating film 68. Hence, a p-base layer 62 does not come into contact with the emitter electrode between the dummy trenches 81 and 82. For this reason, the contact area between the emitter electrode 69 and the p-base layer 62 is further reduced, and larger conductivity modulation can be realized.

When the interval between the ladder-shaped trenches 75 and 76 adjacent to each other is increased, the parasitic capacitance between the gate electrode 64 and the main electrode (collector electrode 70 and emitter electrode 69) is reduced, and nonuniform operation or oscillation phenomenon between devices connected in parallel is suppressed. Especially, when both the gate electrode 64 and conductor 83 in the dummy trench are formed not in a mesh but in a ladder shape, the conductor 83 in the dummy trench can be easily connected to the emitter electrode 69 rather than the gate electrode 64.

Figure 26:
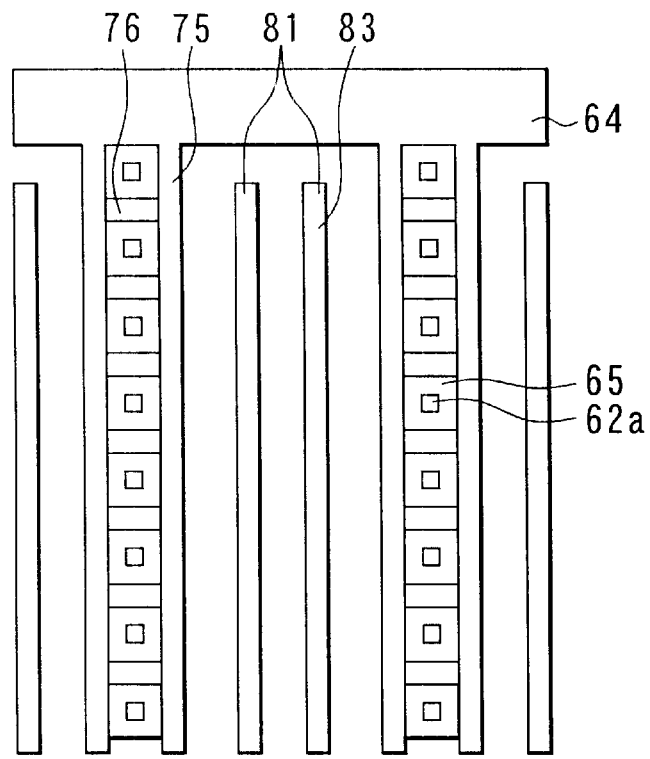
FIG. 26 is a plan view showing the main part of an IGBT according to a modification of the 12th embodiment.

As shown in FIG. 26, the cross dummy trench 82 between the main dummy trenches 81 may be omitted, and the main dummy trenches 81 may have a stripe shape as that of conventional trenches of this type.

Figure 27:
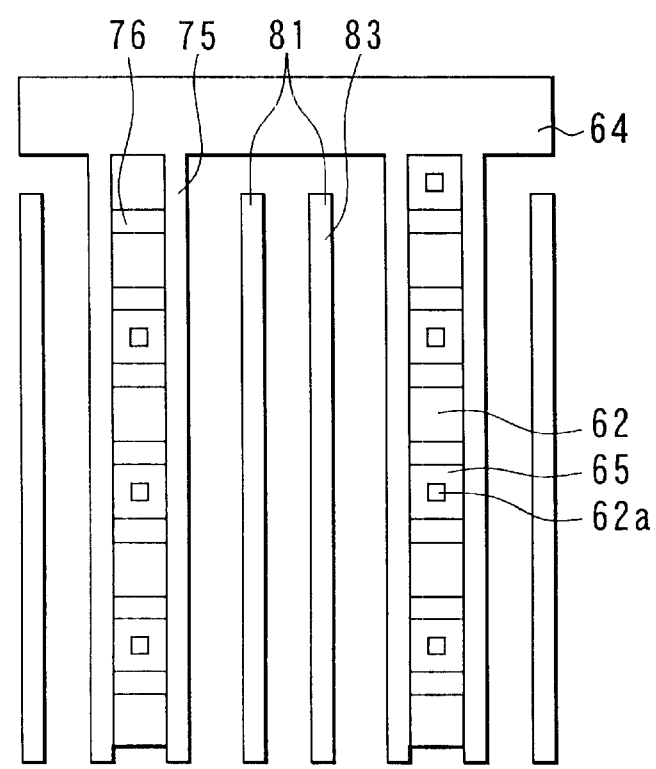
FIG. 27 is a plan view showing the main part of an IGBT according to another modification of the 12th embodiment.

A central exposed portion 62a of the p-base layer 62 need not always be formed at all surface portions of the p-base layer 62, which are surrounded by the main and cross trenches 75 and 76, to be in contact with the emitter electrode 69. For example, as shown in FIG. 27, the central exposed portion 62a may be formed for every other cross trench 76. In addition, the region surrounded by the main and cross trenches 75 and 76 can have not a square shape but a rectangular shape.

The section taken along the vertical direction (direction perpendicular to the line XXV—XXV in FIG. 24) of the IGBT shown in FIG. 24 or 26 is the same as that shown in FIG. 23. The section taken along the vertical direction (direction perpendicular to the line XXV—XXV in FIG. 24) of the IGBT shown in FIG. 27 is the same as that shown in FIG. 22. The section taken along the horizontal direction (direction along the line XXV—XXV in FIG. 24) of the IGBT shown in FIG. 26 or 27 is the same as that shown in FIG. 25.

Note that a semiconductor device with a trench gate according to either the 11th or 12th embodiment can be combined with the improvement in the current path region 41 in each of the first to seventh embodiments, and/or the improvement in the non-current path region 42 in each of the eighth and ninth embodiments.

The present invention has been described above while exemplifying an IGBT. However, the present invention can also be applied to a device such as a trench MOS static induction thyristor which operates according to the same operation principle as that of an IGBT.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device with a trench gate, comprising:
   a first semiconductor layer of first conductivity type;
   second semiconductor layer of second conductivity type, which is arranged on the first semiconductor layer, to inject carriers of second conductivity type into the first semiconductor layer;
   a third semiconductor layer of second conductivity type, which is arranged on the first semiconductor layer, to collect the carriers of second conductivity type in the first semiconductor layer from the first semiconductor layer;
   a pair of trench portions extending through the third semiconductor layer and reaching the first semiconductor layer;
   a pair of gate electrode portions disposed in the pair of trench portions via gate insulating films, respectively;
   a pair of fourth semiconductor layer portions of first conductivity type, which are formed along the pair of trench portions, respectively, in a surface portion of the third semiconductor layer which is not interposed between the pair of trench portions, each of the fourth semiconductor layer portions being arranged to inject carriers of first conductivity type through a channel induced in the third semiconductor layer by the gate electrode portion into the first semiconductor layer and cause conductivity modulation therein;

a first main electrode disposed in contact with the second semiconductor layer;

a second main electrode disposed in contact with the third semiconductor layer and fourth semiconductor layer portions;

an isolation insulating layer formed between the pair of trench portions to completely insulate and isolate, from the first semiconductor layer, a semiconductor layer in a non-current path region interposed between the pair of trench portions; and an additional electrode in contact with the semiconductor layer in the non-current path region, the additional electrode being electrically connected to the second main electrode.

2. The device according to claim 1, wherein the isolation insulating layer is formed at a depth near bottom portions of the pair of trench portions.

3. A semiconductor device with a trench gate, comprising:

a first semiconductor layer of first conductivity type;

a second semiconductor layer of second conductivity type, which is arranged on the first semiconductor layer, to inject carriers of second conductivity type into the first semiconductor layer;

a third semiconductor layer of second conductivity type, which is arranged on the first semiconductor layer, to collect the carriers of second conductivity type in the first semiconductor layer from the first semiconductor layer;

a plurality of main trench portions extending in a first direction along a surface of the third semiconductor layer, and extending through the third semiconductor layer and reaching the first semiconductor layer in a depth direction;

a plurality of cross trench portions extending in a second direction perpendicular to the first direction along the surface of the third semiconductor layer in columns between the main trench portions, and extending through the third semiconductor layer and reaching the first semiconductor layer in a depth direction, the cross trench portions being arranged such that the columns include a first column having the cross trench portions and a second column having no cross trench portions, in which in a plan view of the device, the plurality of main trench portions and the plurality of cross trench portions comprise a plurality of ladder-shaped trenches arranged at given intervals;

a gate electrode disposed in each of the main and cross trench portions via a gate insulating film;

fourth semiconductor layer portions of first conductivity type, each of which is formed along the main and cross trench portions while leaving a central exposed portion of the third semiconductor layer in a surface portion of the third semiconductor layer surrounded by the main and cross trench portions, each of the fourth semiconductor layer portions being arranged to inject carriers of first conductivity type through a channel induced in the third semiconductor layer by the gate electrode into the first semiconductor layer and cause conductivity modulation therein;

a first main electrode disposed in contact with the second semiconductor layer; and a second main electrode disposed in contact with the central exposed portion of the third semiconductor layer and the fourth semiconductor layer portions.

4. The device according to claim 3, further comprising, between the main trench portions, a main dummy trench portion having substantially the same shape as the main trench portion and extending in the same direction as the main trench portion.

5. The device according to claim 4, wherein a conductor is buried in the main dummy trench portion via an insulating film.

6. The device according to claim 5, wherein the conductor in the main dummy trench portion is connected to the second main electrode.

7. The device according to claim 3, wherein the fourth semiconductor layer portions are arranged such that portions of the third semiconductor layer surrounded by the main and cross trench portions include a portion provided with one of the fourth semiconductor layer portions and a portion provided with no fourth semiconductor layer portions.

8. A semiconductor device with a trench gate, comprising:

a first semiconductor layer of first conductivity type;

a second semiconductor layer of second conductivity type, which is arranged on the first semiconductor layer, to inject carriers of second conductivity type into the first semiconductor layer;

a third semiconductor layer of second conductivity type, which is arranged on the first semiconductor layer, to collect the carriers of second conductivity type in the first semiconductor layer from the first semiconductor layer;

a pair of trench portions extending through the third semiconductor layer and reaching the first semiconductor layer;

a pair of gate electrode portions disposed in the pair of trench portions via gate insulating films, respectively;

a fourth semiconductor layer of first conductivity type formed to entirely cover a surface portion of the third semiconductor layer interposed between the pair of trench portions, the fourth semiconductor layer being arranged to inject carriers of first conductivity type through a channel induced in the third semiconductor layer by the gate electrode portion into the first semiconductor layer and cause conductivity modulation therein;

a first main electrode disposed in contact with the second semiconductor layer;

a second main electrode disposed in contact with the third and fourth semiconductor layers; and a narrowing trench formed to extend through the third and fourth semiconductor layers and reach the first semiconductor layer, and to narrow a flow path of the carrier of second conductivity type, which is formed from the first semiconductor layer to the second main electrode through the third semiconductor layer, the second main electrode having an extended portion extending into the narrowing trench and is in contact with the third and fourth semiconductor layers through a side surface of the extended portion, and the extended portion being insulated from the first semiconductor layer by an insulating layer.

9. The device according to claim 8, further comprising a third trench portion extending trough the semiconductor layer and reaching the first semiconductor layer, the third trench portion being substantially equivalent to each of the pair of trench portions, and an isolation insulating layer formed between one of the pair of trench portions and the third trench portion so as to insulate and isolate, from the first semiconductor layer, a semiconductor layer in a non-current path region interposed between the one of the pair of trench portions and the third trench portion.

10. The device according to claim 8, further comprising a third trench portion extending through the third semiconductor layer and reaching the first semiconductor layer, the third trench portion being substantially equivalent to each of the pair of trench portions, and a fifth semiconductor layer of second conductivity type, which is formed in a non-current path region interposed between one of the pair of trench portions and the third trench portion and has a resistance lower than that of the third semiconductor layer, the first and fifth semiconductor layers forming a pn-junction.

11. The device according to claim 8, wherein the pair of trench portions includes portions of a pair of trenches extending parallel to each other, and the narrowing trench extends in the same direction as that of the pair of trenches.

12. The device according to claim 8, wherein the pair of trench portions includes portions opposing each other in a single looped trench, and the narrowing trench is arranged substantially at a center of the looped trench.

13. The device according to claim 8, wherein a portion of the narrowing trench under the third semiconductor layer is filled with an insulator.

14. The device according to claim 8, wherein a conductor is buried in a portion of the narrowing trench under the third semiconductor layer.

* * * * *